United States Patent
Chamas

(10) Patent No.: US 9,647,639 B1
(45) Date of Patent: May 9, 2017

(54) BASEBAND FILTERS AND INTERFACES BETWEEN A DIGITAL-TO-ANALOG CONVERTER AND A BASEBAND FILTER

(71) Applicant: QUALCOMM Incorporated, San Diego, CA (US)

(72) Inventor: Ibrahim Chamas, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/941,419

(22) Filed: Nov. 13, 2015

(51) Int. Cl.
| | |
|---|---|
| H03K 5/00 | (2006.01) |
| H03F 3/45 | (2006.01) |
| H03H 11/12 | (2006.01) |
| H03M 1/66 | (2006.01) |
| H03F 3/21 | (2006.01) |
| H03F 3/19 | (2006.01) |

(52) U.S. Cl.
CPC .......... *H03H 11/1213* (2013.01); *H03F 3/19* (2013.01); *H03F 3/211* (2013.01); *H03F 3/45076* (2013.01); *H03H 11/126* (2013.01); *H03M 1/66* (2013.01); *H03F 2200/294* (2013.01); *H03F 2200/451* (2013.01); *H03F 2203/21106* (2013.01); *H03F 2203/45154* (2013.01)

(58) Field of Classification Search
CPC ... H03H 11/1213; H03H 11/126; H03M 1/66; H03F 3/19; H03F 3/211; H03F 2200/294; H03F 2200/451
USPC ............ 327/551–559, 360–361; 330/258, 69
See application file for complete search history.

(56) References Cited

U.S. PATENT DOCUMENTS

| | | | | |
|---|---|---|---|---|
| 6,696,894 B1* | 2/2004 | Huang | ............... | H03F 3/45417 330/253 |
| 6,753,732 B1* | 6/2004 | Moreland | ........... | H03F 3/45089 330/261 |
| 7,019,678 B1 | 3/2006 | Ziazadeh | | |
| 7,212,586 B2 | 5/2007 | Shi et al. | | |
| 7,456,773 B1 | 11/2008 | Seo et al. | | |
| 7,586,373 B2 | 9/2009 | Kim | | |
| 7,715,836 B2 | 5/2010 | Vassiliou et al. | | |
| 7,969,342 B2* | 6/2011 | Tsuchi | ............... | H03F 3/45179 330/9 |
| 8,587,287 B2* | 11/2013 | Larsen | .................... | G05F 3/262 323/315 |
| 8,731,099 B2* | 5/2014 | Giannini | .............. | H04B 1/0475 375/295 |
| 8,781,411 B2 | 7/2014 | Asuri et al. | | |

(Continued)

OTHER PUBLICATIONS

Allen P.E., "Lecture 320-Differential Output OP Amps (Mar. 27, 2002) p. 320-1 ECE 6412-Analog Integrated Circuit Design-II P Lecture 320-Differential Output OP AMPS," Mar. 27, 2002 (Mar. 27, 2002), 10 Pages, XP55317139, Retrieved from the Internet: URL: http://users.ece.gatech.edu/pallen/Academic/ECE_6412/Spring_2003/L320-DiffOutputOpAmps-2UP.pdf [retrieved on Nov. 8, 2016].

(Continued)

*Primary Examiner* — Dinh T Le
(74) *Attorney, Agent, or Firm* — Toler Law Group, PC

(57) ABSTRACT

Exemplary embodiments of the present disclosure are related to baseband filters. A device may include a digital-to-analog converter (DAC) configured to output a DC current. The device may also include an operational amplifier coupled to an output of the DAC and configured to bias an input stage of the operational amplifier with the DC current.

20 Claims, 17 Drawing Sheets

(56) References Cited

U.S. PATENT DOCUMENTS

| | | |
|---|---|---|
| 8,964,901 B2 | 2/2015 | Kim et al. |
| 2007/0296456 A1 | 12/2007 | van der Goes et al. |
| 2015/0180523 A1 | 6/2015 | Tasic et al. |

OTHER PUBLICATIONS

International Search Report and Written Opinion—PCT/US2016/051506—ISA/EPO—Jan. 12, 2017, 20 pages.

Findlatter K. et al., "A HomePlugAV SoC in 40nm CMOS Technology," Proceedings of the Custom Integrated Circuits Conference, IEEE, Sep. 15, 2014 (Sep. 15, 2014), pp. 1-8, XP032676295, DOI:10.1109/CICC.2014.6945982 [retrieved on Nov. 4, 2014].

Liao C-F. et al., "40 Gb/s Transimpedance-AGC Amplifier and CDR Circuit for Broadband Data Receivers in 90 nm CMOS," IEEE Journal of Solid-State Circuits, IEEE, Service Center, Piscataway, NJ, USA, vol. 43, No. 3, Mar. 1, 2008 (Mar. 1, 2008), pp. 642-655, XP011204868, ISSN: 0018-9200.

Partial International Search Report—PCT/US2016/051506—ISA/EPO—Nov. 18, 2016, 9 pages.

Sackinger E., "The Transimpedance Limit," IEEE Transactions on Circuits and Systems I: Regular Papers, IEEE, US, vol. 57, No. 8, Aug. 11, 2010 (Aug. 11, 2010), pp. 1848-1856, XP011333754, ISSN: 1549-8328, DOI: 10.1109/TCSI.2009.2037847.

Zand B. et al., "A Transimpedance Amplifier with DC-Coupled Differential Photodiode Current Sensing for Wireless Optical Communications," Proceedings of the IEEECustom Integrated Circuits Conference, (CICC 2001), San Diego, CA, May 6-9, 2001, [IEEE Custom Integrated Circuits Conference.CICC], New York, NY: IEEE, US, vol. CONF. 23, May 6, 2001 (May 6, 2001), pp. 455-458, XP010546931, DOI: 10.1109/CICC.2001.929821, ISBN: 978-0/7803-6591-9.

\* cited by examiner

BASEBAND FILTERS AND INTERFACES BETWEEN A DIGITAL-TO-ANALOG CONVERTER AND A BASEBAND FILTER

FIELD

The present disclosure relates generally to electronic devices. More specifically, the present disclosure includes embodiments related to baseband filters and an interfaces between a digital-to-analog converter and a baseband filter.

BACKGROUND

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP Long Term Evolution (LTE) systems, 3GPP2 Ultra Mobile Broadband (UMB) systems, and orthogonal frequency division multiple access (OFDMA) systems.

In a communication system, a transmitter may process (e.g., encode and modulate) data. The transmitter may further condition (e.g., convert to analog, filter, frequency up-convert to radio frequency (RF), and amplify) the data to generate an output RF signal. The transmitter may then transmit the output RF signal via a communication channel to a receiver. The receiver may receive the transmitted RF signal and perform the complementary processing on the received RF signal. The receiver may condition (e.g., amplify, frequency down-convert to baseband, filter, and digitize) the received RF signal to obtain input samples. The receiver may further process (e.g., demodulate and decode) the input samples to recover the transmitted data.

DETAILED DESCRIPTION

The detailed description set forth below in connection with the appended drawings is intended as a description of exemplary embodiments and is not intended to represent the only embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein.

Figure 1:
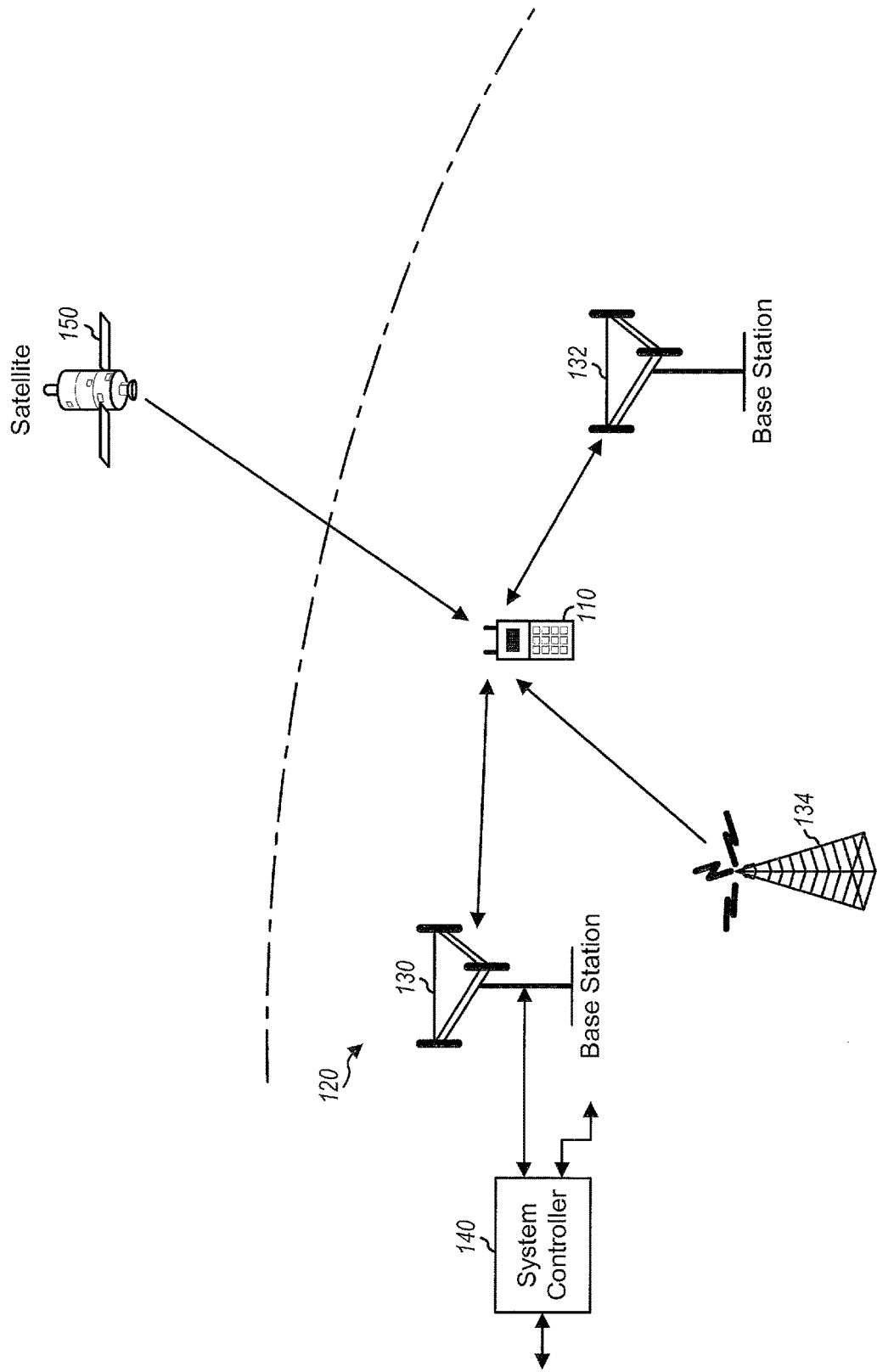
FIG. 1 shows a wireless device communicating with a wireless system, according to an exemplary embodiment of the present disclosure.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
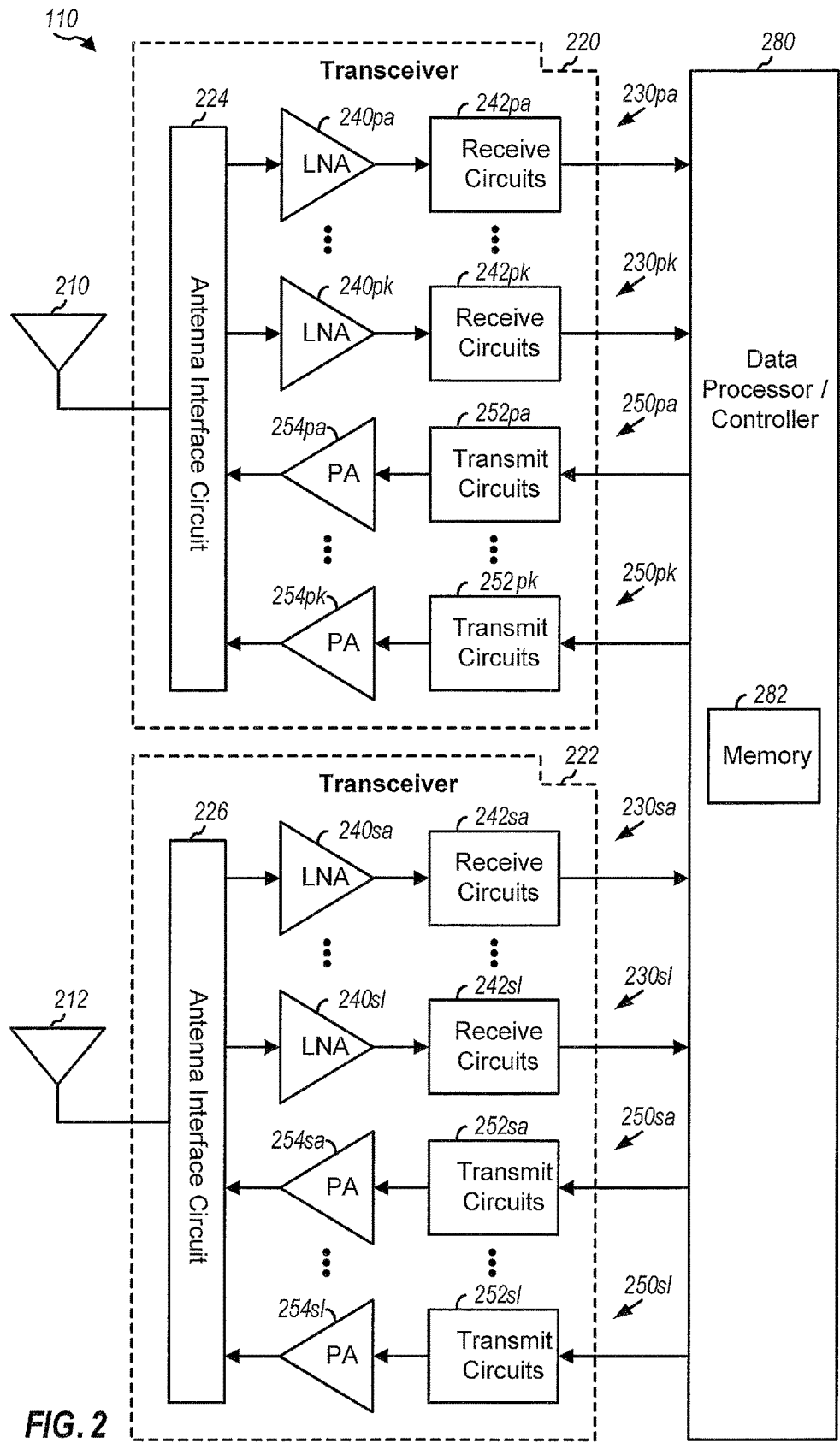
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes L receivers 230*sa* to 230*sl* and L transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230*pa* is the selected receiver. Within receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver 230 in transceivers 220 and 222 may operate in a similar manner as receiver 230*pa*.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in a similar manner as transmitter 250*pa*.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support CA and may (i) receive multiple downlink signals transmitted by one or more cells on multiple downlink carriers at different frequencies and/or (ii) transmit multiple uplink signals to one or more cells on multiple uplink carriers. Transmitters and receivers to support CA may be implemented on a single IC chip. However, it may be difficult or not possible to meet isolation requirements between the transmitters and receivers in certain transmit (TX) and receive (RX) bands due to limited pin-to-pin isolation on the IC chip.

For example, in the inter-CA mode, the isolation requirement between some TX and RX bands (e.g., UMTS Bands 4 and 17) may be 100 decibels (dB), which may be difficult or not possible to achieve since pin-to-pin isolation is worse than the isolation requirement. On-chip transmit filtering may improve pin-to-pin RX/TX isolation but (i) may degrade transmitter performance and (ii) may not reduce other RX/TX coupling mechanisms on the same IC chip. Furthermore, spurious signals from multiple PLLs and LO generators operating simultaneously on the same IC chip may degrade transmitter performance. Sensitivity of a receiver may also be degraded due to poor spurious and isolation performance.

In an aspect of the present disclosure, expandable transceivers and receivers implemented on multiple IC chips may be used to support CA and mitigate the problems described above. Transmitters and receivers on the multiple IC chips may be selected for use such that interference between these transmitters and receivers may be mitigated. As an example, for inter-band CA, a transmitter and a receiver on one IC chip may be used for communication on one band, and another transmitter and another receiver on another IC chip may be used for communication on another band. This may mitigate spurious and isolation problems encountered in the single-chip design.

Figure 3:
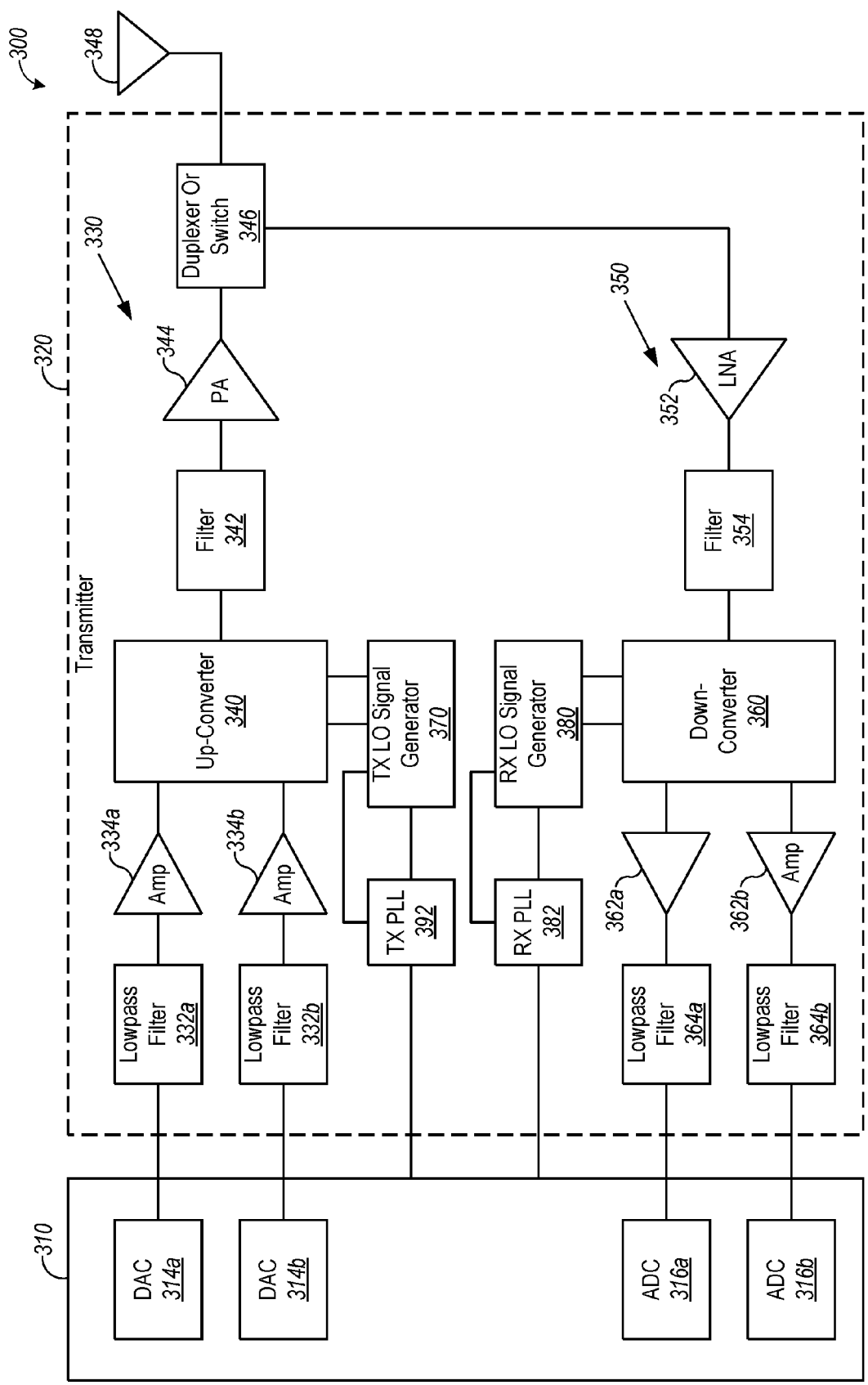
FIG. 3 illustrates a block diagram of a wireless communication device in which the techniques of the present disclosure may be implemented.

FIG. 3 illustrates a block diagram of a wireless communication device 300 in which the techniques of the present disclosure may be implemented. In the design shown in FIG. 3, wireless communication device 300 includes a transceiver 320 and a data processor 310. Transceiver 320 includes a transmitter 330 and a receiver 350 that support bi-directional communication. In general, wireless device 300 may include any number of transmitters and any number of receivers for any number of communication systems and frequency ranges.

A transmitter or a receiver may be implemented with a super-heterodyne architecture or a direct-conversion architecture. In the super-heterodyne architecture, a signal is frequency converted between radio frequency (RF) and baseband in multiple stages (e.g., from RF to an intermediate frequency (IF) in one stage, and then from IF to baseband in another stage for a receiver). In the direct-conversion architecture, a signal is frequency converted between RF and baseband in one stage. The super-heterodyne and direct-conversion architectures may use different circuit blocks and/or have different requirements. In the design shown in FIG. 3, transmitter 330 and receiver 350 are implemented with the direct-conversion architecture.

In the transmit path, data processor 310 processes data to be transmitted and provides I and Q analog output signals to transmitter 330. Within transmitter 330, lowpass filters 332a and 332b filter the I and Q analog output signals, respectively, to remove undesired images and provide noise filtering caused by the prior digital-to-analog conversion. Amplifiers (Amp) 334a and 334b amplify the signals from filters 332a and 332b, respectively, and provide I and Q baseband signals. It is noted that a filter, such as filters 332a and 332b, may comprise one or more of the various embodiments disclosed herein. More specifically, for example, one or more of filters 332a and 332b may include one or more of device 600 (see FIG. 7), device 800 (see FIG. 9), operational amplifier 900 (see FIG. 12), operational amplifier 960 (see FIG. 14), system 980 (see FIG. 16) and system 985 (see FIG. 17).

An upconverter 340 upconverts the I and Q baseband signals with I and Q transmit (TX) local oscillating (LO) signals from a TX LO signal generator 370 and provides an upconverted signal. A filter 342 filters the upconverted signal to remove undesired images caused by the frequency upconversion as well as noise in a receive frequency range. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives signals transmitted by base stations and provides a received RF signal, which is routed through duplexer or switch 346 and provided to a low noise amplifier (LNA) 352. The received RF signal is amplified by LNA 352 and filtered by a filter 354 to obtain a desired RF input signal. A downconverter 360 downconverts the RF input signal with I and Q receive (RX) LO signals from an RX LO signal generator 380 and provides I and Q baseband signals. The I and Q baseband signals are amplified by amplifiers 362a and 362b and further filtered by lowpass filters 364a and 364b to obtain I and Q analog input signals, which are provided to data processor 310.

TX LO signal generator 370 generates the I and Q TX LO signals used for frequency upconversion. RX LO signal generator 380 generates the I and Q RX LO signals used for frequency downconversion. Each LO signal is a periodic signal with a particular fundamental frequency. A TX PLL 392 receives timing information from data processor 310 and generates a control signal used to adjust the frequency and/or phase of the TX LO signals from LO signal generator 370. Similarly, an RX PLL 382 receives timing information from data processor 310 and generates a control signal used to adjust the frequency and/or phase of the RX LO signals from LO signal generator 380. In an embodiment, an LO buffer (not shown) may be provided at the output of the TX LO signal generator 370 or the RX LO signal generator 380 to buffer the VCO output from the subsequent load.

FIG. 3 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Some circuit blocks in FIG. 3 may also be omitted. All or a portion of transceiver 320 may be implemented on one or more analog integrated circuits (ICs), RF ICs (RFICs), mixed-signal ICs, etc.

Figure 4:
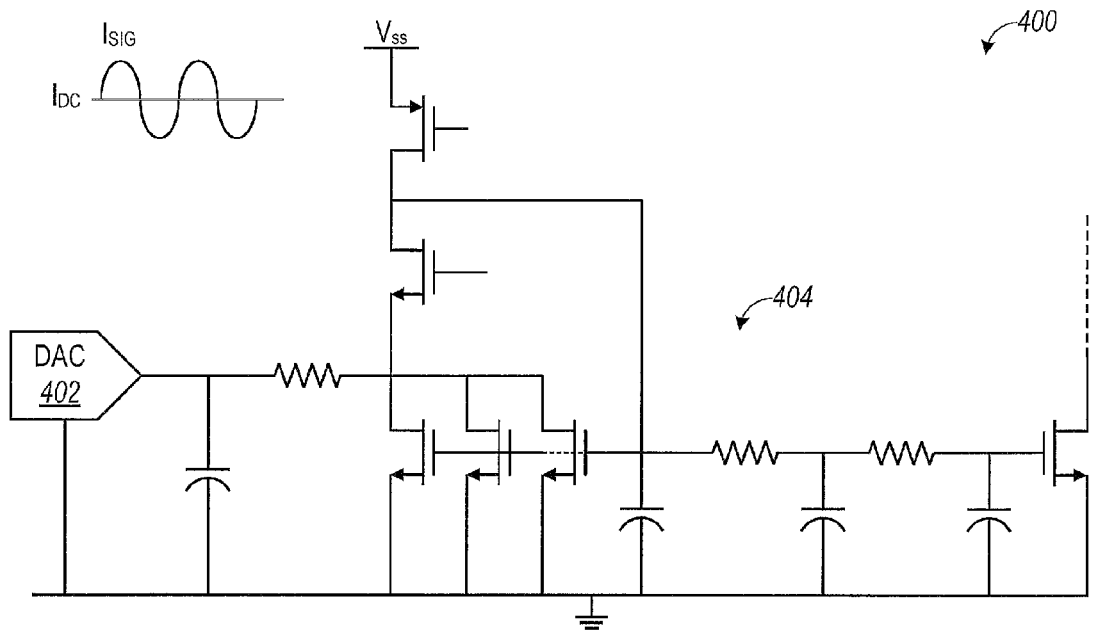
FIG. 4 depicts a device including a digital-to-analog converter coupled to a passive anti-alias baseband filter.

FIG. 4 illustrates a device 400 including a digital-to-analog converter (DAC) 402 coupled to a passive anti-alias filter 404. Device 400, which provides filtering and subsequent amplification, allows for differential cap integration and has a small area footprint (i.e., due to nonlinear high density metal-oxide-semiconductor capacitors (MOSCAPS)). However, device 400 exhibits low linearity in that inner poles exhibit a trade-off between rejection and linearity even if linear metal-oxide metal (MOM) caps are used. Moreover, device 400 is not easily configured into a complementary class B design, and exhibits high consumption unless converted into a class B design.

Figure 5:
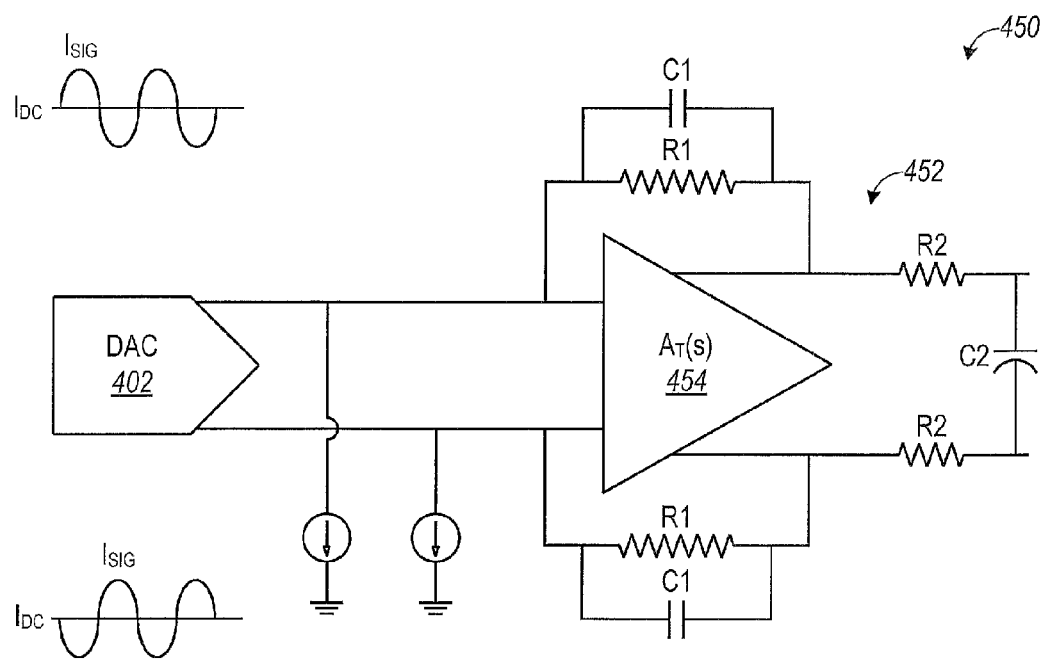
FIG. 5 illustrates a device including digital-to-analog converter coupled to an active anti-alias baseband filter.

FIG. 5 illustrates a device 450 which includes a DAC 402 and a baseband filter 452, which includes an operational amplifier 454. Device 450 may exhibit good linearity by virtue of feedback and has a low input impedance. In addition, device 450 may function with a high-Q complex pole for good receive-band noise, and exhibits low current consumption. However, device 450 requires a comparatively large area. Further, DC current from DAC 402 flows to a ground voltage and, thus, is wasted.

Figure 6:
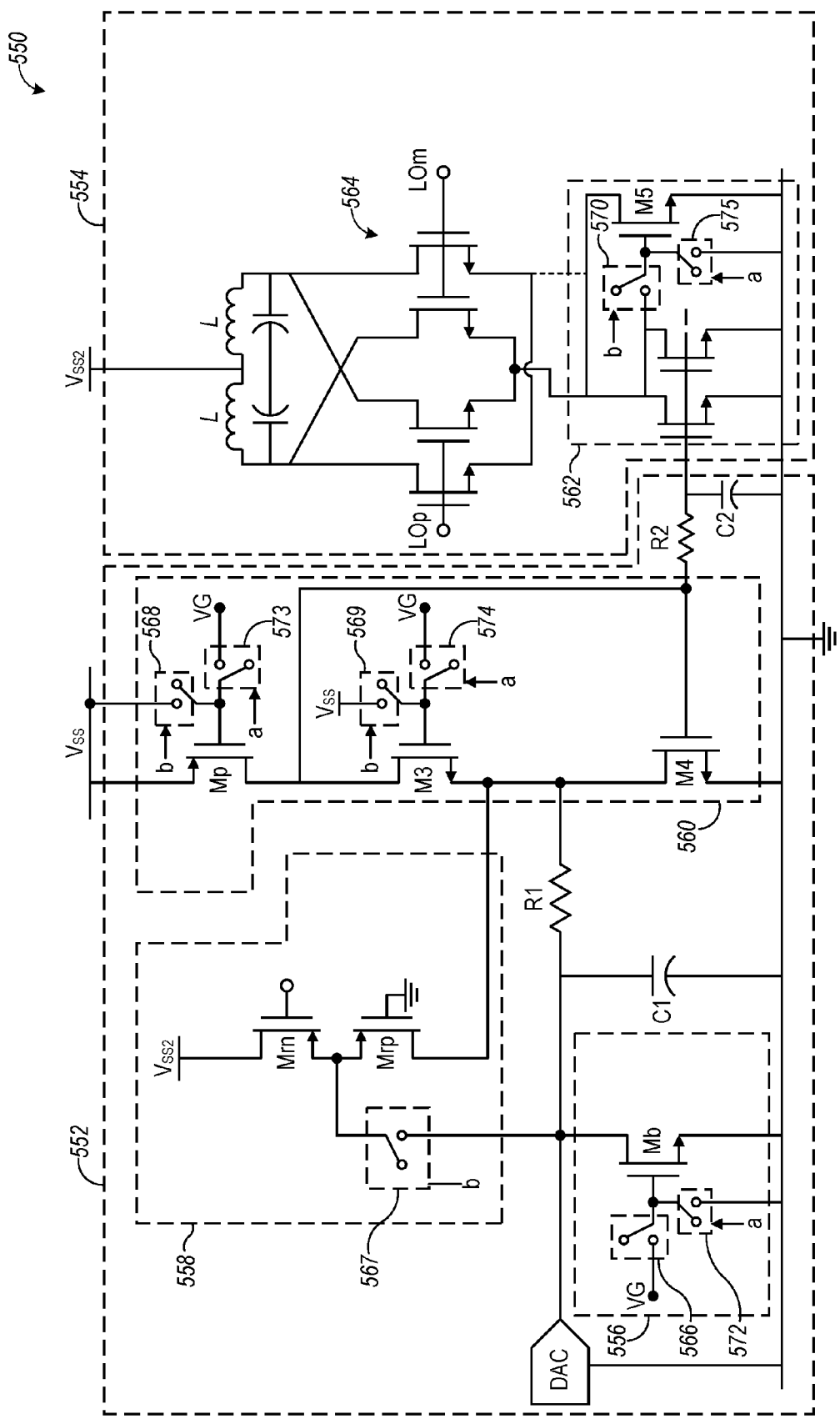
FIG. 6 illustrates a configurable passive anti-alias baseband filter coupled to an active upconverter.

FIG. 6 shows a portion of a wireless transmitter 550 comprising a configurable passive baseband filter 552 and an active upconverter 554. Baseband filter 552 and upconverter 554 have configurable efficiency and are configurable between operation in a Class-A mode (first efficiency level) and operation in a higher efficiency operating mode, such as Class A/B, Class B, or Class C (second efficiency level). The higher efficiency mode is used during low output power to conserve battery current during talk-time or during other low output power time intervals. Baseband filter 552 and upconverter 554 are configurable into a Class-A operating mode to meet maximum power requirements.

As shown in FIG. 6, baseband filter 552 comprises a DAC with a variable DC current bleed circuit 556 including transistor Mb, a half-wave current rectifier circuit 558 including transistors Mrn and Mrp, a single-pole RC filter (i.e., resistor R1 and capacitor C1), a configurable transimpedance input loop 560 including transistors M3, M4, and Mp, and a second RC pole including resistor R2 and capacitor C2. Upconverter 554 comprises a configurable transconductance cell 562 including a set of transistors that feed upconverter quad switching devices 564.

Baseband filter 552 and upconverter 554 further comprise additional circuitry and switches that are used to configure baseband filter 552 and upconverter 554 between a Class-A operating mode and a higher efficiency operating mode. For example, the efficiency of baseband filter 552 and upconverter 554 are configured by switches 566-570 and switches 572-575. The switches operate to set bias conditions and circuit connections that configure baseband filter 552 and upconverter 554 to operate in either the Class-A operating mode or the higher efficiency operating mode, for example, a Class B operating mode.

In the higher efficiency Class-B operating mode, current bleed circuit 556 drains the DC current component (IDC) of a DAC output to ground through transistor Mb. The remaining AC current with amplitude (Im), travels to rectifying transistors Mrn and Mrp of half-wave current rectifier circuit 558. In contrast to various embodiments described below including a closed-loop design that exhibits good linearity and low current consumption, the embodiment illustrated in FIG. 6 is an open-loop design that exhibits low linearity.

Figure 7:
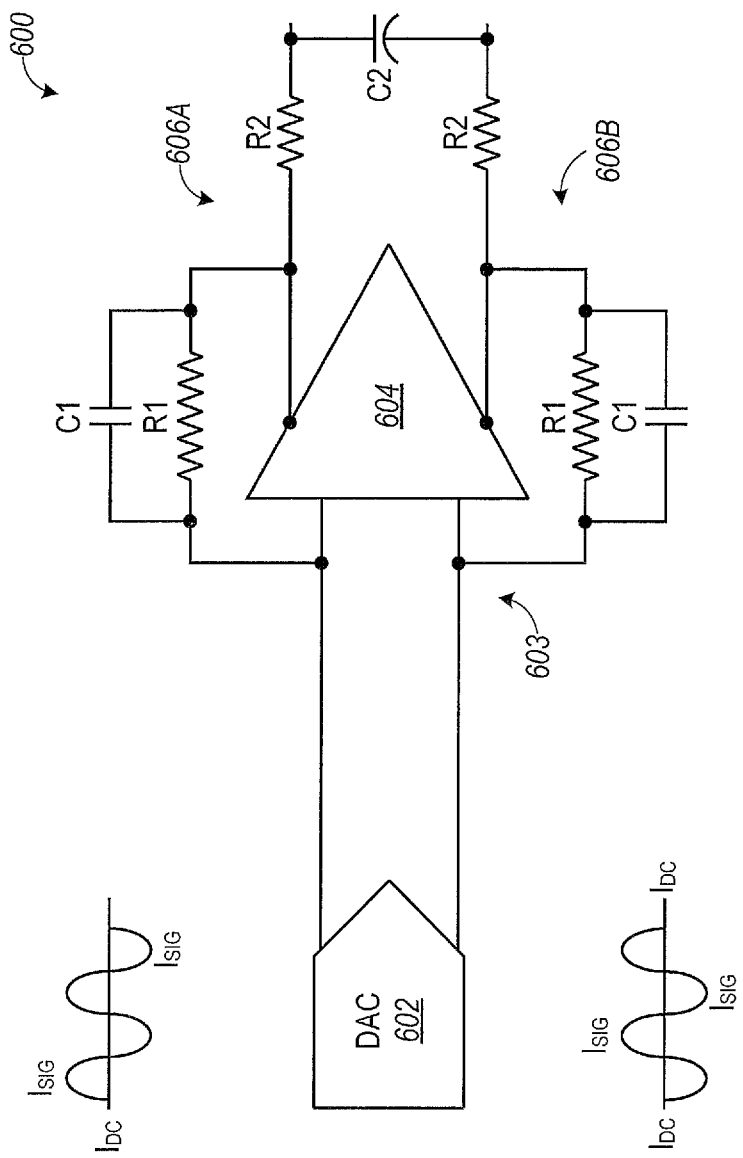
FIG. 7 illustrates a device including a digital-to-analog converter coupled to a baseband filter, according to an exemplary embodiment of the present disclosure.

FIG. 7 illustrates a device 600, according to an exemplary embodiment of the present disclosure. Device 600 includes a DAC 602 and an active anti-alias baseband filter 603. Baseband filter 603 includes an operational amplifier 604, a path 606A including a resistor R1 for amplifying a first signal (i.e., a first differential data signal) and a capacitor C1 for filtering the first signal, and a path 606B including resistor R1 for amplifying a second signal (i.e., a second differential data signal) and capacitor C1 for filtering the second signal. Baseband filter 603 further includes resistors R2 coupled to each output of operational amplifier 604, and a capacitor C2 coupled between resistors R2. Resistors R2 and capacitor C2 may provide additional filtering for a signal output from operational amplifier 604. It is noted that a signal $I_{SIG}$ (e.g., a data signal) output from DAC 602 may be received by paths 606A and 606B, and a DC current $I_{DC}$ output from DAC 602 may be received by operational amplifier 604. As will be described more fully below, device 600 is configured to use a DC current output from DAC 602 (i.e., DC current $I_{DC}$) to bias an input stage of operational amplifier 604.

Figure 8:
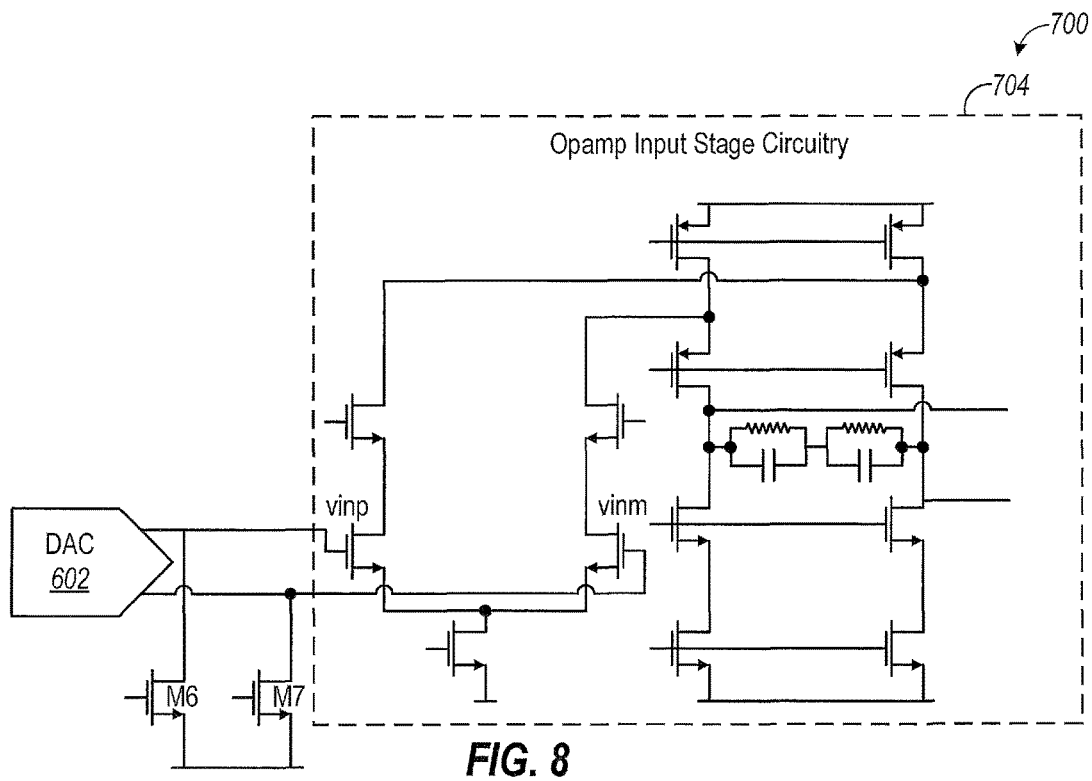
FIG. 8 illustrates a device including a digital-to-analog converter coupled to an input stage of an operational amplifier of an active anti-alias baseband filter.

FIG. 8 depicts a device 700 including DAC 602, transistors M6 and M7, and operational amplifier input stage 704, which includes a plurality of transistors. During operation of device 700, DC current from DAC 602 flows to ground GRND via transistors M6 and M7 and, thus, is wasted. Further, device 700 requires biasing for input stage 704.

Figure 9:
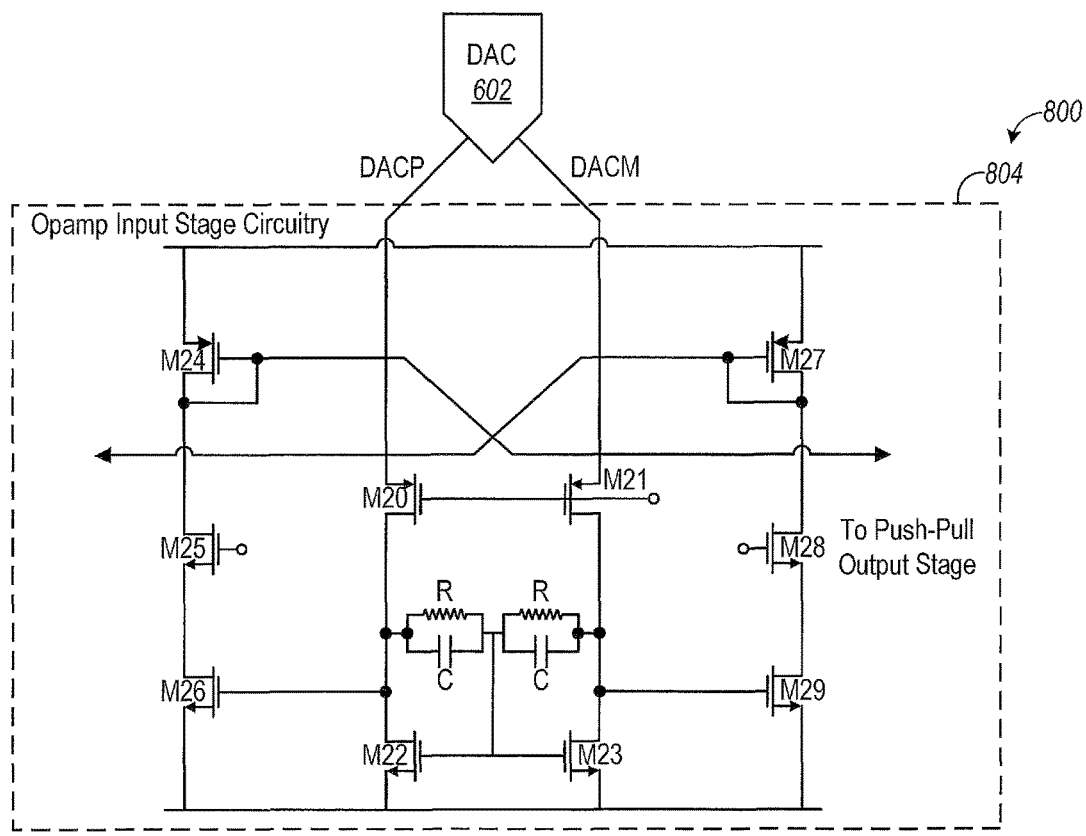
FIG. 9 illustrates another device including a digital-to-analog converter coupled to an input stage of an operational amplifier of an active anti-alias baseband filter, in accordance with an exemplary embodiment of the present disclosure.

FIG. 9 depicts a device 800 including DAC 602 coupled to operational amplifier input stage 804, in accordance with an exemplary embodiment of the present disclosure. Input stage 804 includes a plurality of transistors M20-M29. Transistor M20 is coupled to a first differential input DACP of input stage 804 and transistor M21 is coupled to a second differential input DACM of input stage 804. More specifically, for example, a source of transistor M20 is coupled to a first differential input DACP of input stage 804 and a source of transistor M21 is coupled to a second differential input DACM of input stage 804. As described more fully below, a drain of transistor M24 is coupled to a gate of transistor M24, which is further coupled to a gate of an output transistor (not shown in FIG. 9). Moreover, a drain of transistor M27 is coupled to a gate of transistor M27, which is further coupled to a gate of another output transistor (not shown in FIG. 9). In this embodiment, a DC current output from DAC 602 may be used to bias input stage 804 and, thus, input stage 804 may not require an additional bias current. In addition to re-using of the DAC bias current, the input stage signal drive may also be extracted from $I_{SIG}$.

Figure 10:
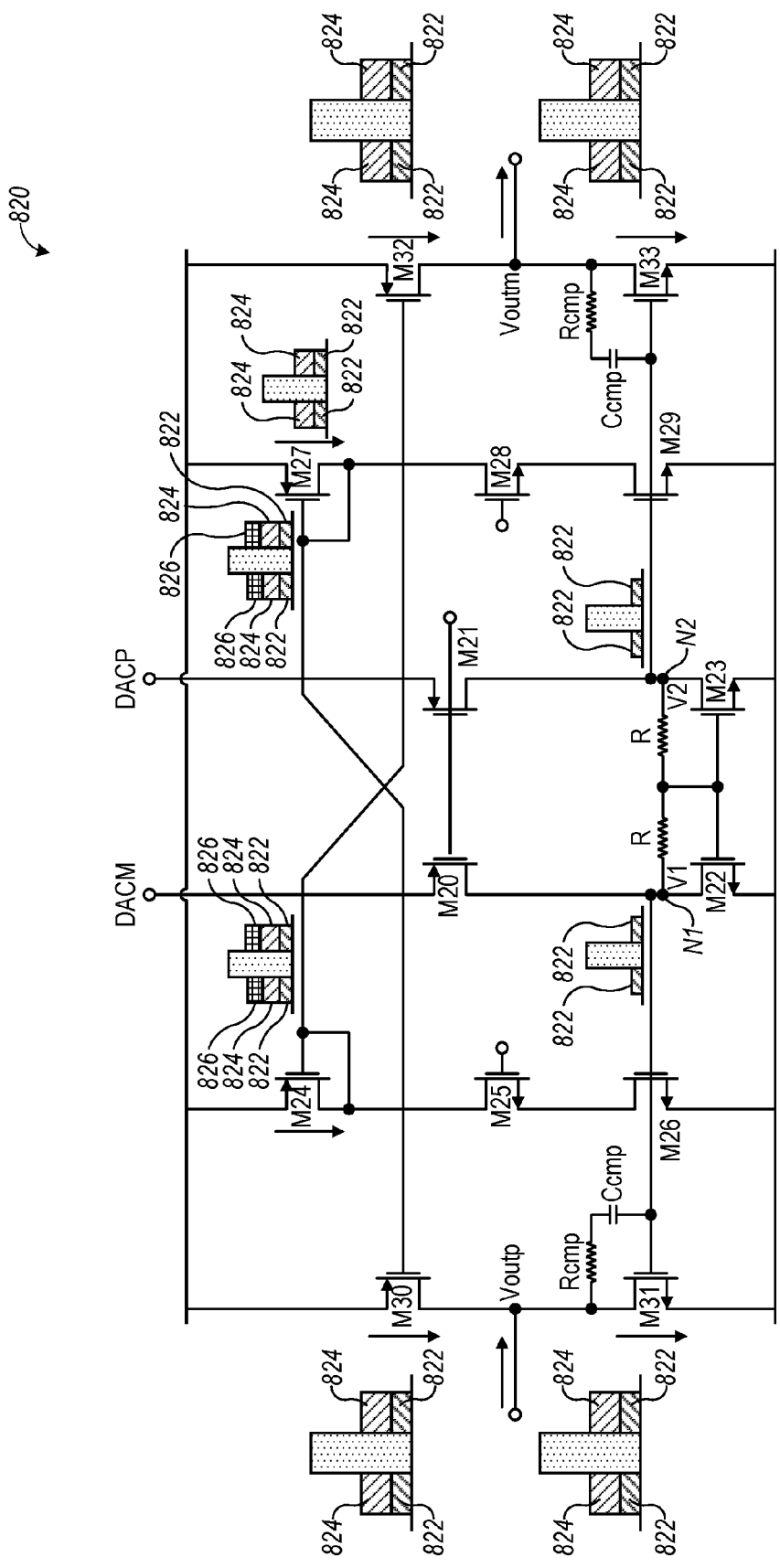
FIG. 10 depicts a simplified view of the operational amplifier with modulated signal spectrum, according to an exemplary embodiment of the present disclosure.

FIG. 10 depicts a simplified view of an operational amplifier 820 (e.g., operational amplifier 604 of FIG. 7), according to an exemplary embodiment of the present disclosure. Also shown are the modulated signal distortion components at the input, intermediate, and output nodes of operational amplifier 820. Operational amplifier 820 includes transistors M20-M33, resistors R, resistors Rcmp, and capacitors Ccmp. As illustrated, transistors M20 and M21 may be coupled together at their gates, transistor M20 (e.g., a source of transistor M20) is coupled to a first differential input DACM of input stage 820 and transistor M21 (e.g., a source of transistor M21) is coupled to a second differential input DACP of operational amplifier 820. A first differential output Voutm of operational amplifier 820 is coupled between transistor M32 and transistor M33 (e.g., between a drain of transistor M32 and a drain of transistor M33). Further, a second differential output Voutp of operational amplifier 820 is coupled between transistor M30 and transistor M31 (e.g., between a drain of transistor M30 and a drain of transistor M31).

A node N1 is coupled to each of transistor M22, transistor M20, transistor M26, and transistor M31. More specifically, for example, node N1 is coupled to each of a drain of transistor M22, a drain of transistor M20, a gate of transistor M26, and a gate of transistor M31. Further, for example, node N1 is further coupled to a gate of transistor M22 and a gate a transistor M23 via resistor R. A node N2 is coupled to transistor M23, transistor M21, transistor M29 and transistor M33. More specifically, for example, node N2 is coupled to a drain of transistor M23, a drain of transistor M21, a gate of transistor M29 and a gate of transistor M33. Node N2 may be further coupled to a gate of transistor M22 and a gate of transistor M23 via resistor R.

As further examples, a gate of transistor M32 may be coupled to a gate of transistor M24, which is further coupled to a drain of transistor M24. Further, a drain of transistor M24 may be coupled to a drain of transistor M26 via transistor M25. Also, a gate of transistor M30 may be coupled to a gate of transistor M27, which may further be coupled to a drain of transistor M27. Moreover, a drain of transistor M27 may be coupled to a drain of transistor M29 via transistor M28. Transistors M30, M24, M27, and M32 may be coupled together via their sources, and transistors M31, M26, M22, M23, M29 and M33 may be coupled together via their sources.

As will be appreciated, input signals (i.e., received from a DAC, such as DAC 602) may generate a voltage V1 at node N1 and a voltage V2 at node N2. Voltage V2 may generate a current $i_{29}$ through transistor M29 according to the following equation:

$$i_{29} = \alpha_1 v_2 + \alpha_2 v_2^2 + \alpha_3 v_2^3; \quad (1)$$

wherein $\alpha_1$, $\alpha_2$, and $\alpha_3$ are the Taylor series expansion coefficients of a nonlinear transistor i-v transfer function.

Further, current i29 may generate a gate-to-source voltage $V_{gs27}$ of transistor 27, which is given by:

$$v_{ga27} = F(\alpha_1 v_2 + \alpha_2 v_2^2 + \alpha_3 v_2^3); \quad (2)$$

wherein F is a nonlinear current-to-voltage converter.

Further, voltage V2 may generate a current $i_{33}$ through transistor M33 given by:

$$i_{33}=M\alpha_1 v_2+M\alpha_2 v_2^2+M\alpha_3 v_2^3; \quad (3)$$

wherein M is a current amplification factor.

Also, voltage V1 may generate a current $i_{26}$ through transistors M26 according to the following equation:

$$i_{26}=\alpha_1 v_1+\alpha_2 v_1^2+\alpha_3 v_1^3. \quad (4)$$

Further, current $i_{26}$ may generate a gate-to-source voltage $V_{gs24}$ of transistor M24, which is given by:

$$v_{ga24}=F(\alpha_1 v_1+\alpha_2 v_1^2+\alpha_3 v_1^3); \quad (5)$$

wherein F is a nonlinear current-to-voltage converter.

Further, voltage V1 may generate a current $i_{31}$ through transistor M31 given by:

$$i_{31}=M\alpha_1 v_1+M\alpha_2 v_1^2+M\alpha_3 v_1^3. \quad (6)$$

As noted above, a gate of output transistor M32 is coupled to a gate of transistor M24, and a gate of output transistor M30 is coupled to a gate of transistor M27. Further, according to one embodiment, a "current mirror" network, which couples the gate of output transistor M32 to the gate of transistor M24 and the gate of output transistor M30 to the gate of transistor M27 may be high-bandwidth network. As will be appreciated, transistors M32 and M24 form a current mirror, and transistors M27 and M30 form a current mirror. A current through transistor M32 is given by:

$$i_{32}=M*F^{-1}\{F(\alpha_1 v_1+\alpha_2 v_1^2+\alpha_3 v_1^3)\}=M\alpha_1 v_1+M\alpha_2 v_1^2+M\alpha_3 v_1^3. \quad (7)$$

And an output current at differential output Voutm is ($v_{diff}=v_1-v_2$):

$$i_{outm}=i_{32}-i_{33}=M\alpha_1 v_{diff}+M\alpha_3 v_{diff}^3. \quad (8)$$

Further, a current $i_{30}$ through transistor M30 is given by:

$$i_{30}=M*F^{-1}\{F(\alpha_1 v_2+\alpha_2 v_2^2+\alpha_3 v_2^3)\}=M\alpha_1 v_2+M\alpha_2 v_2^2+M\alpha_3 v_2^3. \quad (9)$$

An output current at differential output Voutp is given by:

$$i_{outp}=i_{30}-i_{31}=-M\alpha_1 v_{diff}-M\alpha_3 v_{diff}^3. \quad (10)$$

FIG. 10 further includes bars 822, 824, and 826, which respectively represent NMOS current-to-voltage (i2v) distortion, NMOS voltage-to-current (v2i) distortion, and PMOS current-to-voltage (i2v) distortion at associated portions of operational amplifier 820. As will be appreciated, output current distortion is dominated by a single voltage-to-current (v2i) conversion, especially component 824, which results in a very low current distortion. Further, the output current distortion includes only the distortion of NMOS devices, and PMOS distortion component 826 is cancelled by virtue of the current mirror functionality (i.e., current mirror M27 and M30 and current mirror M24 and M32). This may be made possible if the bandwidth of the current mirror is wide enough to support distortion component 826. The bandwidth of the current mirrors may be dominated by the output driver device capacitances, specifically transistors M30 and M32.

Figure 11:
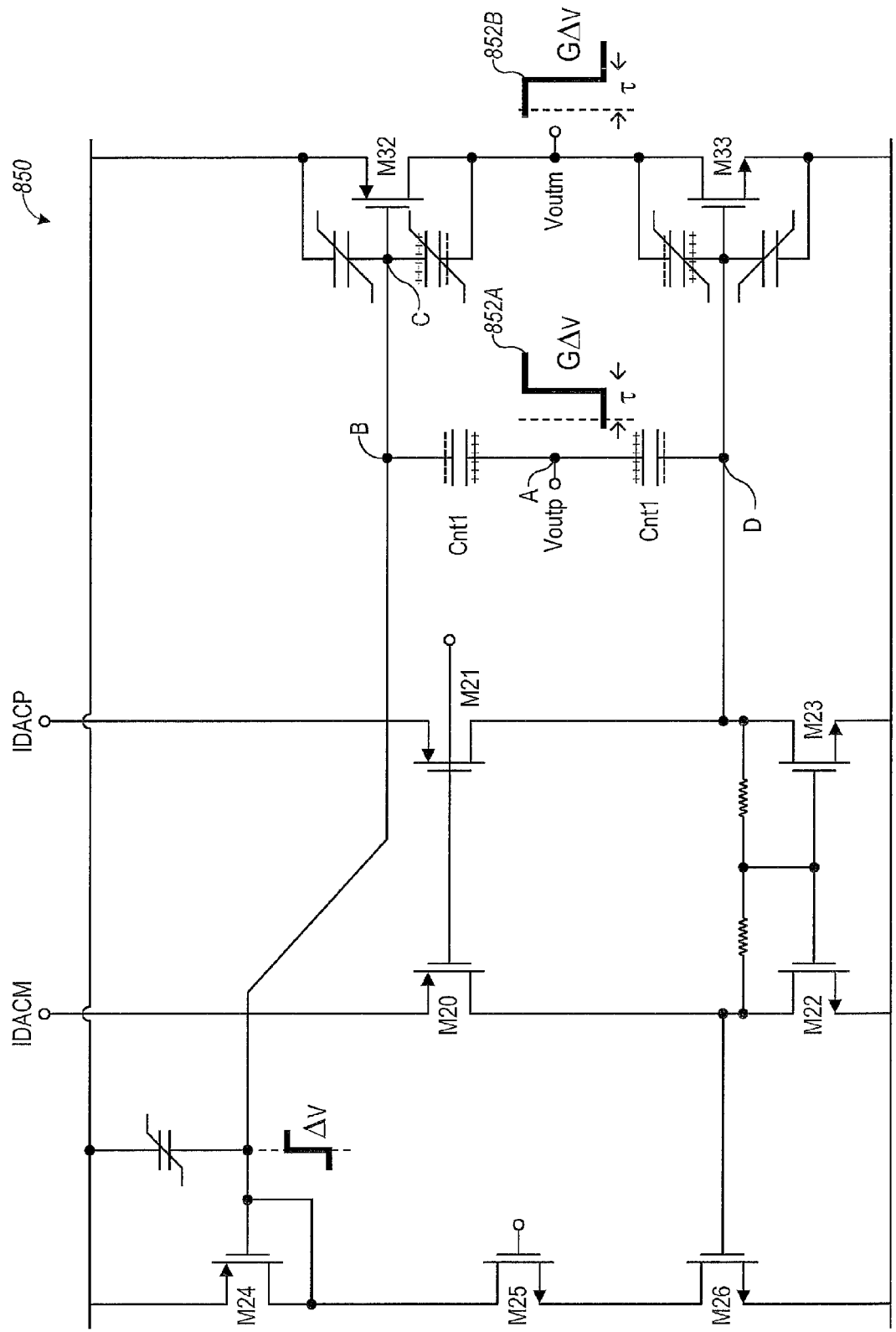
FIG. 11 illustrates a portion of an operational amplifier including neutralization capacitors, according to an exemplary embodiment of the present disclosure.

FIG. 11 depicts an exemplary device 850, which may be configured for capacitance cancellation that may neutralize the gate-to-drain capacitance (Cgd) of the output devices (e.g., transistors M32 and M33) of an operational amplifier output stage. Device 850 depicts transistors M20-M26 and M32 and M33 and output Voutm. Further, device 850 includes one or more capacitors Cnt1 coupled between the gates of transistors M32 and M33. Further, in an embodiment wherein device 850 includes two capacitors Cnt1, a node A between capacitors Cnt1 is coupled to output Voutp.

As will be appreciated, a step voltage at output Voutp, as depicted by signal 852A, is the inverse to a voltage at output Voutm by virtue of differential operation, as depicted by 852B. To shift the voltage by ΔV, a net positive charge may be deposited at node B (equivalently, a net negative charge needs to escape node B). The capacitance of node B may be dominated by the Cgd of transistor M32. Without capacitor Cnt1, the net positive charge may take the path through the conductance of transistor M24. Transistor M24 may be biased at very low current to save battery current of user equipment transmitter block. The RC time constant formed by the low conductance transistor M24 and the high Cgd capacitance of transistor M32 may limit the bandwidth of the current mirror formed by transistors M24 and M32. Device 850 may use capacitor Cnt1 to provide an alternative path to the charging current of node B. For a ΔV at node B, the Voutp node swings by GΔV (G is the gain of the operational amplifier output stage from gate of transistors M32/M33 to drain of transistors M32/M33), thereby providing G times drive strength and high conductance path. The amount of negative charge deposited by Cnt1 at node B is given by:

$$-\Delta Q=\Delta V(1-G)C_{nt1}. \quad (11)$$

Further, a change in charge required by Cgd of transistor M32 at a node C may be given by:

$$+\Delta Q=\Delta V(G+1)C_{gd}. \quad (12)$$

Equating these two charges, a value of capacitor Cnt1 may be given by:

$$C_{nt1}=\frac{G+1}{G-1}C_{gd}. \quad (13)$$

It should be appreciated that the second Cnt1 capacitor added between nodes A and D serves the same purpose but for Cgd of transistor M33 and is included for symmetry purposes. Further, it should be appreciated that the charge assistance provided by Cnt1 extends the bandwidth of the current mirrors inside the operational amplifier 820 forming pairs (i.e., transistors M24, M32) and (transistors M27, M30). By extending the bandwidth with capacitor Cnt1, the current mirror output transistors (M30 and M32) may cancel out the distortion components 826 generated by replica diode connected transistors M24 and M27. In one embodiment, capacitor Cnt1 can be implemented using a scaled replica of the output transistors with the source and drain connected. This may allow for the neutralizing capacitor and target capacitor Cgd to include tracking capacitance-voltage (CV) characteristics.

Figure 12:
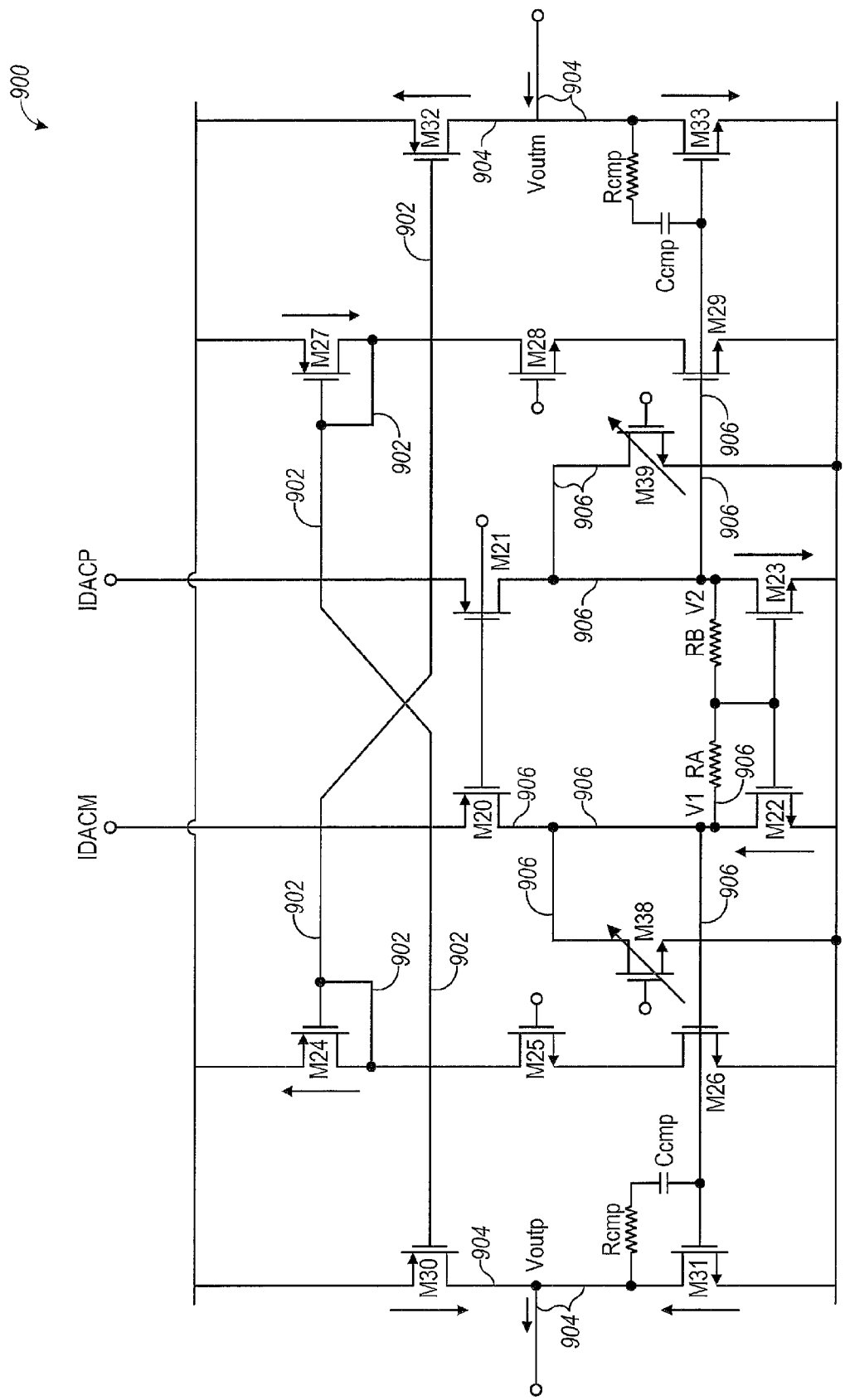
FIG. 12 illustrates a full schematic view of an operational amplifier with a single RC feedback pole, in accordance with an exemplary embodiment of the present disclosure.

FIG. 12 depicts a device 900 which is an extension to the simplified operational amplifier of FIG. 10 including internal current leaker transistors M38 and M39 that may be used to control the efficiency of the operational amplifier, in accordance with an exemplary embodiment of the present disclosure.

Figure 13:
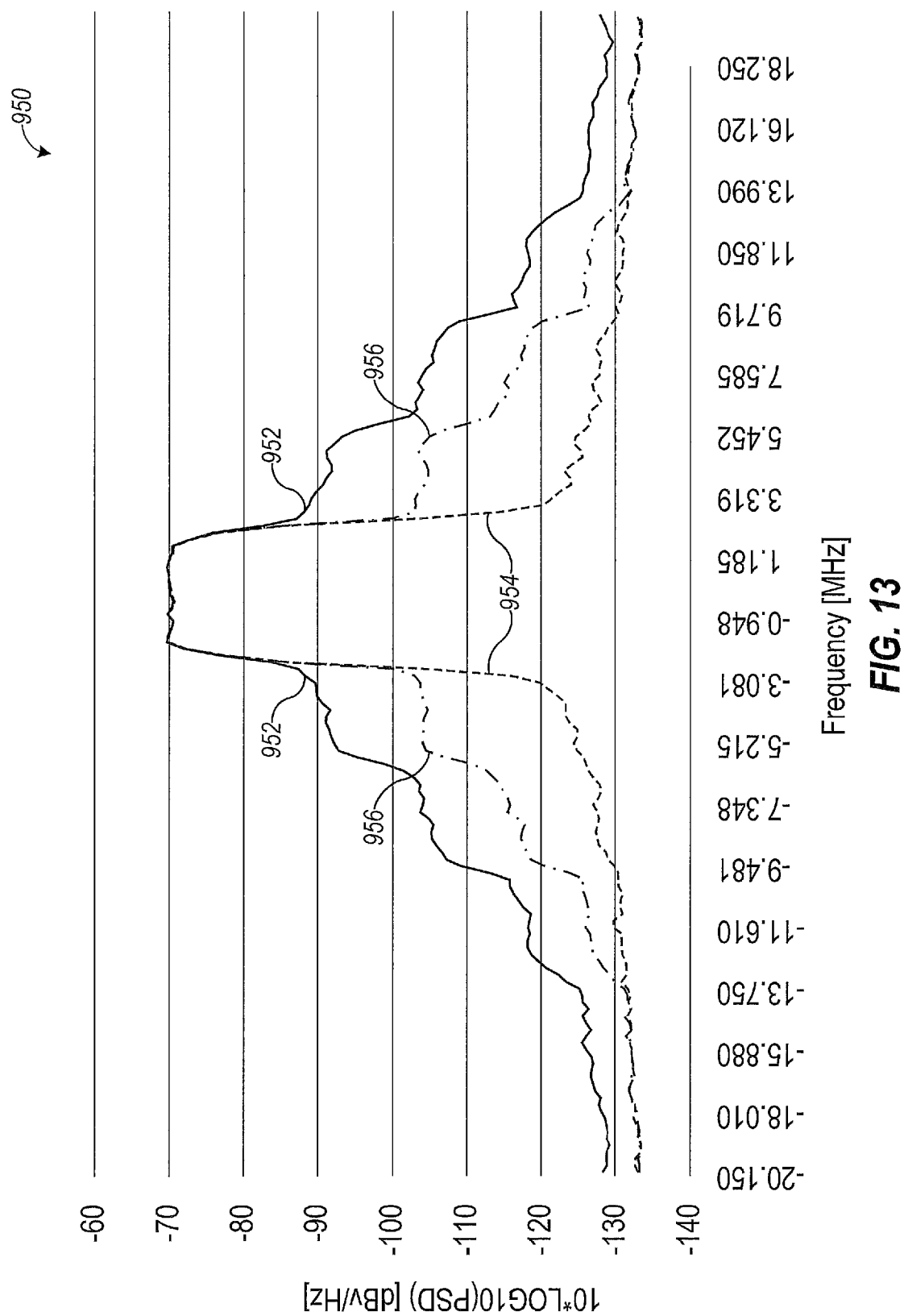
FIG. 13 is a plot depicting adjacent channel leakage ratios at the input, intermediate, and output nodes of the operational amplifier of FIG. 12.

FIG. 13 is a plot 950 depicting adjacent channel leakage ratio (ACLR) of various networks within device 900 (see FIG. 13) across frequency. Specifically, signal 952 shows the ACLR for network 902, signal 954 shows the ACLR for network 904 (operational amplifier output current), and signal 956 shows the ACLR for network 906. It should be appreciated that although network 902 is highly nonlinear, the output current of the current mirror may be linear due to the bandwidth extension provided by Cnt1.

It is noted that device 900 (see FIG. 12) may comprise a closed-loop, self-learning system, wherein the nonlinearity of the operational amplifier and the internal signals (i.e., connections 902 of FIG. 13) are predistorted such that a response of the operational amplifier resembles that of the feedback resistor.

Figure 14:
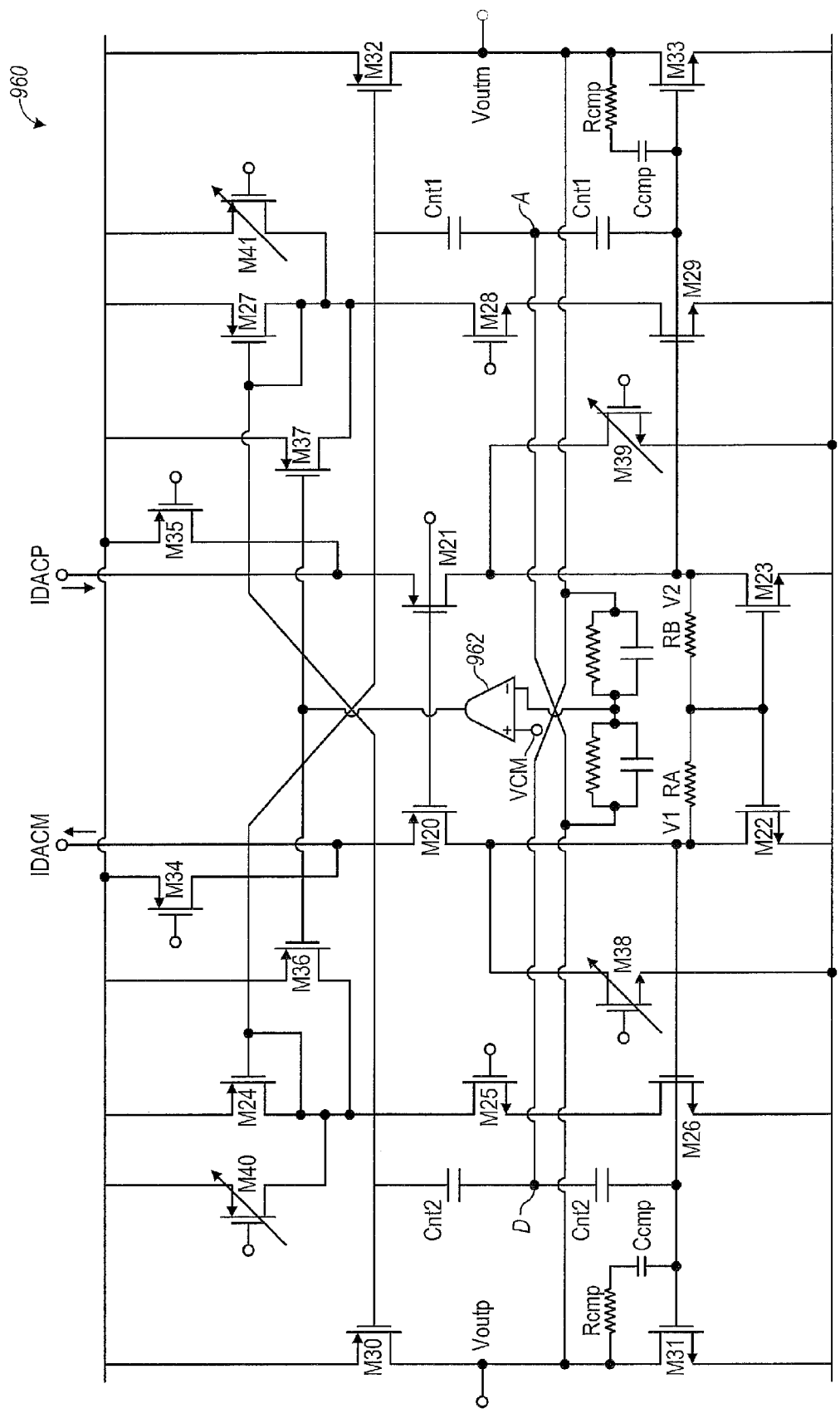
FIG. 14 is a schematic view of an operational amplifier including programmability, neutralization capacitors, and common-mode feedback, according to an exemplary embodiment of the present disclosure.

FIG. 14 depicts a schematic view 960 of an operational amplifier 960, according to an exemplary embodiment of the present disclosure. In addition to the components of FIG. 12, the exemplary embodiment includes transistors M40 and M41 that serve as pmos leaker current sources, and transistors M36 and M37 that serve with a transconductor 962 as a common-mode feedback reference loop.

As noted above, a gate and drain of transistor M24 is coupled to a gate of transistor M32, wherein transistors M24 and M32 provide a current mirror. Further, a gate and drain of transistor M27 is coupled to a gate of transistor M30, wherein transistors M27 and M30 provide another current mirror. Further capacitors Cnt1 are coupled between the gates of output transistors M32 and M33, and node A is coupled to output Voutp. Moreover, capacitors Cnt2 are coupled between the gates of output transistors M30 and M31, and a node D is coupled to output Voutn.

Figure 15:
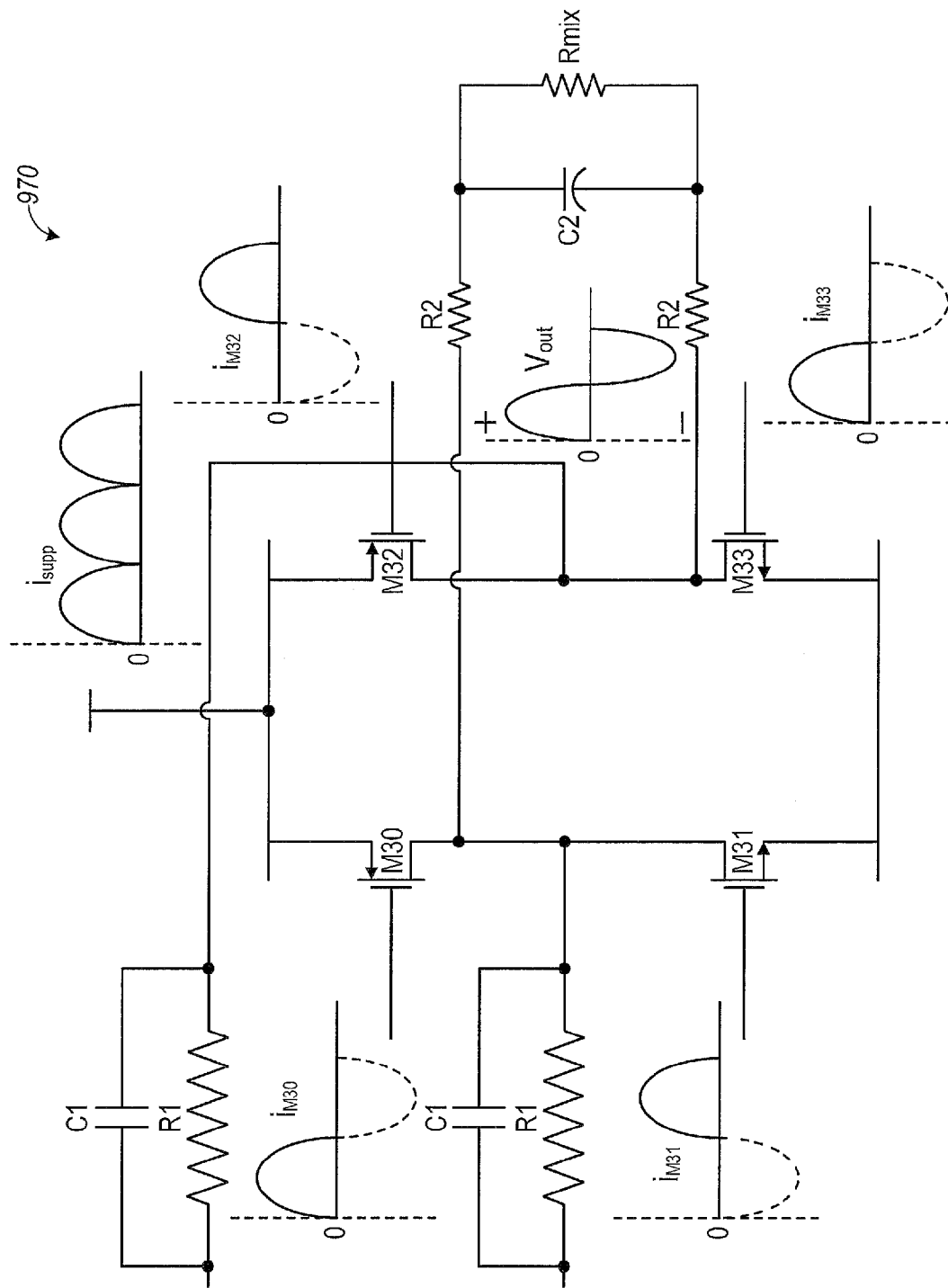
FIG. 15 depicts current swings of a push-pull output stage of an operational amplifier driving a feedback network and an RC passive load.

FIG. 15 illustrates the output push-pull stage 970 of an operational amplifier, in accordance with an exemplary embodiment of the present disclosure. Stage 970 includes output transistors M30-33, resistors R1, capacitors C1, resistors R2, capacitors C2, and resistor Rmix. FIG. 15 further illustrates waveforms iM30, iM31, iM32, and iM33 respectively representing currents through transistors M30, M31, M32, and M33 in high efficiency push-pull operation. In addition, waveform $i_{supp}$ represents the supply current in the output stage of the operational amplifier and curve Vout represents an output voltage across the load.

A minimum baseband filter current may be determined by the load impedance and desired output swing. Assuming that the baseband filter is only composed of a push-pull stage and that a DAC is directly driving the output stage, if the push-pull stage can source/sink the current with 50% duty cycle, then the minimum supply current is given by the following equation:

$$I_{supp,min} = \frac{2}{\pi}\left[\sqrt{2} * I_{dac,dc} * 10^{(-PAPR/20)} + \frac{V_{odiff,pk}}{R_{L,diff}}\right]; \quad (14)$$

wherein:

$$V_{odiff,pk} = \sqrt{2} * V_{supp} * 10^{(-PAPR/20)}. \quad (15)$$

wherein $I_{dac,dc}$ is the DAC midscale current, PAPR is peak-to-average power ratio of the digitally modulated basedband data, $V_{odiff,pk}$ is the desired differential output voltage, $V_{supp}$ is the supply voltage, and $R_{L,diff}$ is the differential load resistor.

Figure 16:
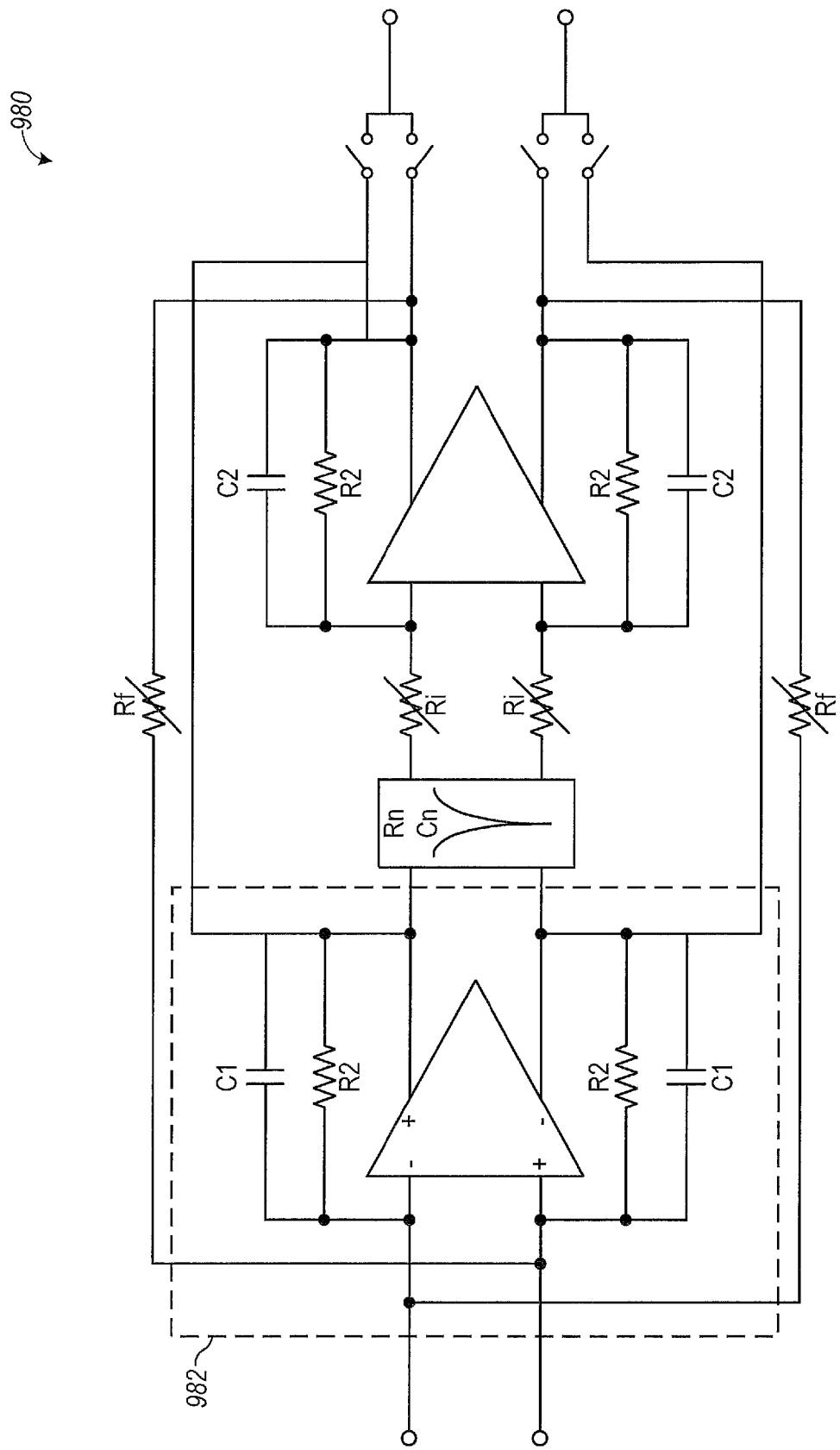
FIG. 16 illustrates a system, in accordance with an exemplary embodiment of the present disclosure.

FIG. 16 depicts an exemplary filter system 980 including a plurality of filter stages. More specifically, system 980 may comprise a BiQuad filter topology including a transimpedance amplifier. It is noted that device 982 may comprise one or more of the embodiments disclosed herein. More specifically, device 982 may comprise filter 603 (see FIG. 7), operational amplifier input stage circuitry 804 (see FIG. 9), operational amplifier 820 (see FIG. 10), device 900 (see FIG. 12), operational amplifier 960 (see FIG. 14), or any combination thereof.

Figure 17:
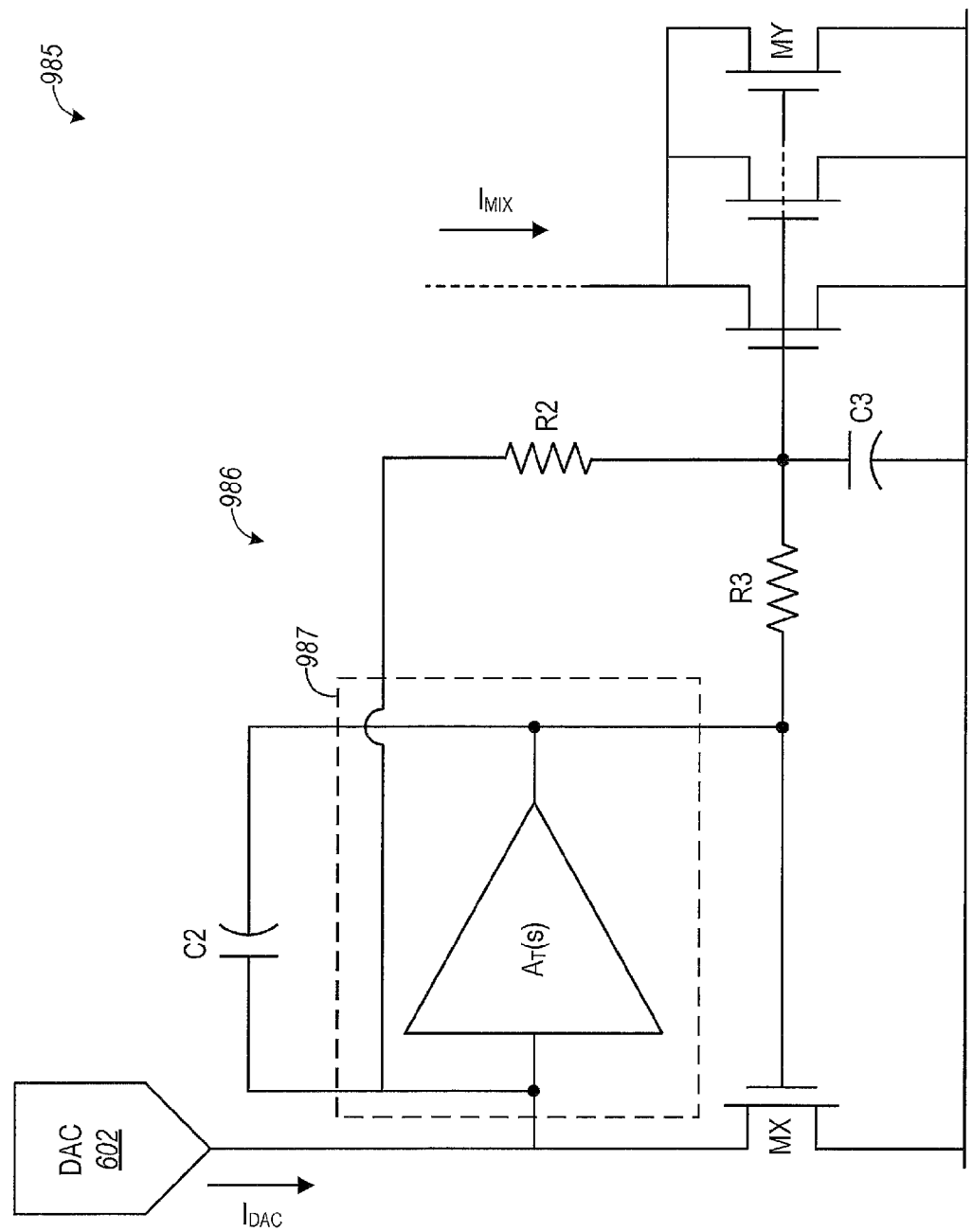
FIG. 17 illustrates another system, according to an exemplary embodiment of the present disclosure.

FIG. 17 illustrates an exemplary system 985 including DAC 602 and a baseband filter 986. Baseband filter 986 comprises a second-order active feedback device including a current mirror (i.e., via transistors MX and MY) and a device 987. It is noted that device 987 may comprise one or more of the embodiments disclosed herein. More specifically, device 987 may comprise filter 603 (see FIG. 7), operational amplifier input stage circuitry 804 (see FIG. 9), operational amplifier 820 (see FIG. 10), device 900 (see FIG. 12), operational amplifier 960 (see FIG. 14), or any combination thereof.

Figure 18:
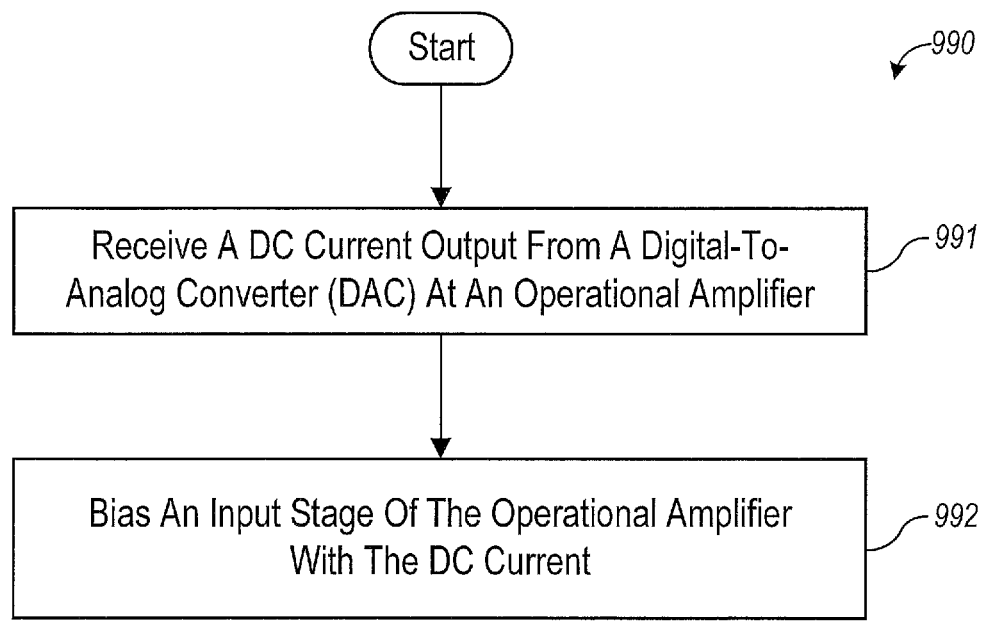
FIG. 18 is a flowchart depicting a method, in accordance with an exemplary embodiment of the present disclosure.

FIG. 18 is a flowchart illustrating a method 990, in accordance with one or more exemplary embodiments. Method 990 may include receiving a DC current output from a digital-to-analog converter (DAC) at an operational amplifier (depicted by numeral 991). Method 990 may also include biasing an input stage of the operational amplifier with the DC current (depicted by numeral 992).

Figure 19:
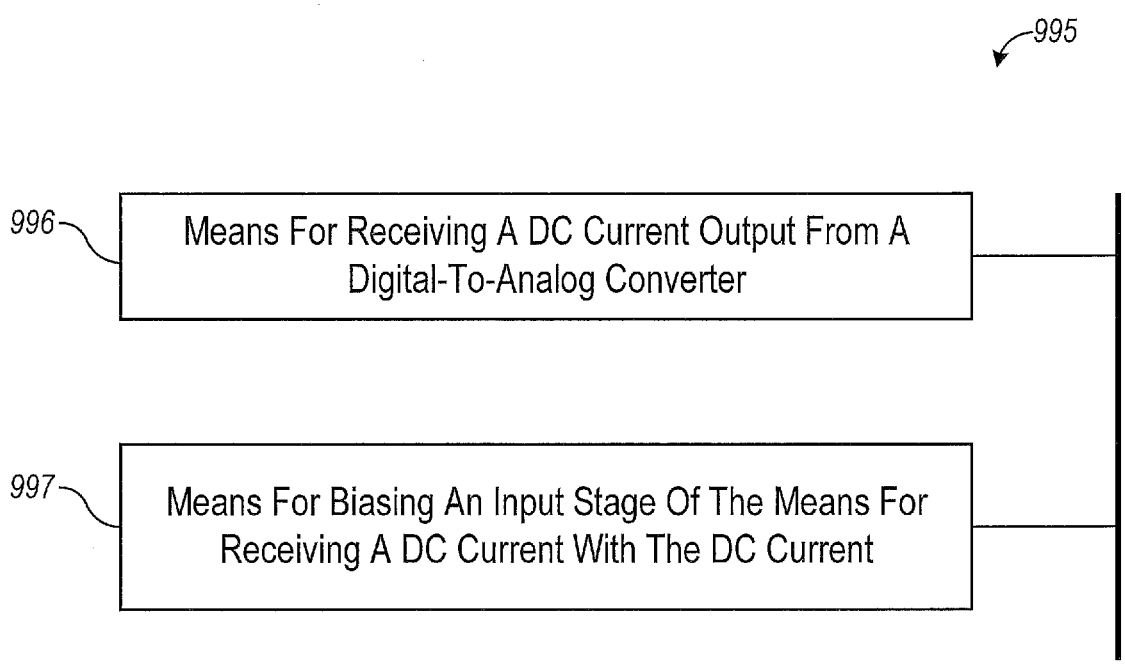
FIG. 19 shows a filter device, according to an exemplary embodiment of the present disclosure.

FIG. 19 shows an exemplary embodiment of filter device 995. For example, device 995 is suitable for use as a baseband filter. In an aspect, device 995 is implemented by one or more modules configured to provide the functions as described herein. For example, in an aspect, each module comprises hardware and/or hardware executing software.

Device 995 comprises a first module comprising means (996) for receiving a DC current output from a digital-to-analog converter (DAC) For example, means 996 may comprise an operational amplifier, such as operational amplifier 604 (see FIG. 7).

Device 995 also comprises a second module comprising means (997) for biasing an input stage of the means for receiving a DC current with the DC current. For example, means 997 may comprise an input stage of an operational amplifier, such as input stage 804 (see FIG. 9), operational amplifier 820 (see FIG. 10), operational amplifier 960 (see FIG. 14).

Various embodiments of the present disclosure may achieve the fundamental minimum current consumption required by a baseband filter (e.g., an active TIA LP BBF) in a transmit chain. Further, DC current steering current inside an operational amplifier may provide accurate and dynamic control of efficiency with transmit gain control. Further, various embodiments provide more than a 35% reduction in power consumption compared to existing solutions. Moreover, internal charge sharing for bandwidth extension improves operational amplifier linearity at minimum current consumption.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the disclosure.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present disclosure. Various modifications to these exemplary embodiments will be readily apparent to those skilled in the art, and the generic principles defined herein may be applied to other embodiments without departing from the spirit or scope of the disclosure. Thus, the present disclosure is not intended to be limited to the exemplary embodiments shown herein but is to be accorded the widest scope consistent with the principles and novel features disclosed herein.

What is claimed is:

1. A device, comprising:
a digital-to-analog converter (DAC) configured to output a direct current (DC) output; and
an operational amplifier coupled to an output of the DAC, the output of the DAC configured to bias an input stage of the operational amplifier with the DC output, wherein a differential output of the operation amplifier comprises a first output coupled between a first pair of output transistors and a second output coupled between a second pair of output transistors.

2. The device of claim 1, wherein a first drain of a first transistor of the first pair of output transistors is coupled to a second drain of a second transistor of the first pair of output transistors, and wherein a third drain of a third transistor of the second pair of output transistors is coupled to a fourth drain of a fourth transistor of the second pair of output transistors.

3. The device of claim 1, further comprising:
a first pair of capacitors coupled between the first pair of output transistors, the second output is coupled between the first pair of output transistors; and
a second pair of capacitors coupled between the second pair of output transistors, the first output is coupled between the second pair of output transistors.

4. The device of claim 3, the first pair of capacitors coupled between a gate of a first transistor of the first pair of output transistors and a gate of a second transistor of the first pair of output transistors, and the second pair of capacitors coupled between a gate of a first transistor of the second pair of output transistors and a gate of a second transistor of the second pair of output transistors.

5. The device of claim 1, wherein the input stage of the operational amplifier comprises:
a first transistor, a first drain of the first transistor coupled to a second drain of a second transistor; and
a third transistor, a third drain of the third transistor coupled to a fourth drain of a fourth transistor, wherein the DC output is configured to generate a first bias voltage at a first node coupled to the first drain and to the second drain, and wherein the DC output is configured to generate a second bias voltage at a second node coupled to the third drain and to the fourth drain.

6. The device of claim 1, further comprising a baseband filter coupled to the output of the DAC, wherein the operational amplifier is a component of the baseband filter.

7. The device of claim 6, wherein the baseband filter comprises:
a first resistor coupled between the first output and a first input of the operational amplifier;
a first capacitor coupled between the first output and the first input of the operational amplifier and in parallel with the first resistor;
a second resistor coupled between the second output and a second input of the operational amplifier; and
a second capacitor coupled between the second output and the second input of the operational amplifier and in parallel with the second resistor.

8. The device of claim 7, wherein the baseband filter further comprises:
a third resistor having a first end coupled to the first output of the operational amplifier;
a fourth resistor having a first end coupled to the second output of the operational amplifier; and
a third capacitor coupled between a second end of the third resistor and a second end of the fourth resistor.

9. The device of claim 1, wherein the input stage comprises:
a first current mirror including a first output transistor of the first pair of output transistors; and
a second current mirror including a first output transistor of the second pair of output transistors.

10. The device of claim 9, wherein the first current mirror further includes a third transistor, and wherein a gate of the first output transistor of the first pair of output transistors is coupled to a gate of the third transistor and to a drain of the third transistor, wherein the second current mirror further includes a fourth transistor, and wherein a gate of the first output transistor of the second pair of output transistors is coupled to a gate of the fourth transistor and to a drain of the fourth transistor.

11. The device of claim 9, wherein the first current mirror and the second current mirror are configured to cancel a p-channel metal-oxide semiconductor (PMOS) distortion component of an output current of the operational amplifier.

12. The device of claim 1, further comprising a BiQuad filter coupled to the output of the DAC, wherein the operational amplifier is a component of the BiQuad filter.

13. The device of claim 1, wherein the DAC and the operational amplifier are integrated into a mobile device.

14. The device of claim 1, wherein a gate of a first transistor of the input stage is coupled to the output of the DAC via a second transistor of the input stage.

15. The device of claim 14, wherein the DAC is further configured to output a differential output that includes the DC output.

16. A method, comprising:
receiving a direct current (DC) output from an output of a digital-to-analog converter (DAC) at an operational amplifier;
biasing an input stage of the operational amplifier with the DC output; and
providing a differential output, a first output of the differential output provided via a first amplifier output coupled between a first pair of output transistors of the operational amplifier, and a second output of the differential output provided via a second amplifier output coupled between a second pair of output transistors.

17. The method of claim 16, wherein biasing the input stage of the operational amplifier with the DC output comprises:
receiving a first voltage at a first drain of a first transistor of the input stage of the operational amplifier, the first drain of the first transistor coupled to a second drain of a second transistor of the input stage of the operational amplifier; and
receiving a second voltage at a third drain of a third transistor of the input stage of the operational amplifier, the third drain of the third transistor coupled to a fourth drain of a fourth transistor of the input stage of the operational amplifier.

18. A device, comprising:
means for receiving a direct current (DC) output from an output of a digital-to-analog converter (DAC);
means for biasing an input stage of the means for receiving with the DC output; and
means for outputting a differential output from the means from receiving, the means for outputting a differential output including a first output coupled between a first pair of output transistors and a second output coupled between a second pair of output transistors.

19. The device of claim 18, wherein the input stage includes means to mirror current.

20. The device of claim 19, wherein the means to mirror current includes a first transistor of the first pair of output transistors and a second transistor of the input stage, wherein a first gate of the first transistor is coupled to a second gate of the second transistor and to a first drain of the second transistor, and wherein the first transistor and the second transistor comprise p-channel metal-oxide semiconductor (PMOS) transistors.

* * * * *